(12) United States Patent
Yamada et al.

(10) Patent No.: US 12,740,080 B2
(45) Date of Patent: Sep. 15, 2026

(54) INSULATED GATE BIPOLAR TRANSISTOR

(71) Applicant: FUJI ELECTRIC CO., LTD., Kanagawa (JP)

(72) Inventors: Takuya Yamada, Matsumoto-city (JP); Seiji Noguchi, Matsumoto-city (JP); Yosuke Sakurai, Azumino-city (JP); Ryutaro Hamasaki, Matsumoto-city (JP); Daisuke Ozaki, Okaya-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 411 days.

(21) Appl. No.: 18/451,869

(22) Filed: Aug. 18, 2023

(65) Prior Publication Data

US 2023/0395706 A1 Dec. 7, 2023

Related U.S. Application Data

(63) Continuation of application No. PCT/JP2022/032121, filed on Aug. 25, 2022.

(30) Foreign Application Priority Data

Sep. 16, 2021 (JP) ................................ 2021-151593

(51) Int. Cl.
*H10D 12/00* (2025.01)
*H10D 62/10* (2025.01)
(Continued)

(52) U.S. Cl.
CPC ......... *H10D 12/481* (2025.01); *H10D 62/109* (2025.01); *H10D 62/393* (2025.01);
(Continued)

(58) Field of Classification Search
CPC .. H10D 12/441; H10D 12/461; H10D 12/481; H10D 62/109; H10D 62/393; H10D 64/117; H10P 30/21; H10P 30/204
See application file for complete search history.

(56) References Cited

U.S. PATENT DOCUMENTS 7,948,005 B2 * 5/2011 Mori .................... H10D 62/393 257/132
2008/0150017 A1 6/2008 Yoneda
(Continued)

FOREIGN PATENT DOCUMENTS

CN 101694850 A 4/2010
JP H08316479 A 11/1996
(Continued)

OTHER PUBLICATIONS

Office Action issued for counterpart Japanese Application No. 2023-548382, transmitted from the Japanese Patent Office on Mar. 4, 2025 (drafted on Feb. 18, 2025).
(Continued)

*Primary Examiner* — Caleen O Sullivan
*Assistant Examiner* — Brett Squires

(57) ABSTRACT

Provided is an insulated gate bipolar transistor including: a base region which is provided between an emitter region and a drift region; an accumulation region which is provided between a base region and a drift region, and which has a doping concentration higher than that of the drift region; a gate trench portion which is provided from an upper surface of a semiconductor substrate to a portion below the accumulation region; and a lower end region which is provide to be in contact with a lower end of the gate trench portion; wherein the accumulation region has a first concentration peak in which the doping concentration indicates a maximum value in a depth direction, and a distance between the first concentration peak and the lower end region in a depth
(Continued)

direction is less than a distance between the first concentration peak and the base region in the depth direction.

20 Claims, 8 Drawing Sheets

(51) Int. Cl.
*H10D 62/17* (2025.01)
*H10D 62/60* (2025.01)
*H10D 64/00* (2025.01)
*H10P 30/20* (2026.01)

(52) U.S. Cl.
CPC ......... *H10D 64/117* (2025.01); *H10P 30/204* (2026.01); *H10P 30/21* (2026.01)

(56) References Cited

U.S. PATENT DOCUMENTS

| | | | |
|---|---|---|---|
| 2008/0283867 | A1 | 11/2008 | Mori |
| 2012/0267681 | A1 | 10/2012 | Nemoto |
| 2016/0211334 | A1 | 7/2016 | Tanaka |
| 2018/0158815 | A1 | 6/2018 | Onozawa |
| 2018/0301550 | A1 | 10/2018 | Sakurai |
| 2018/0350961 | A1 | 12/2018 | Naito |
| 2019/0006496 | A1 | 1/2019 | Kanda |
| 2019/0252533 | A1 | 8/2019 | Naito |
| 2020/0152778 | A1 | 5/2020 | Naito |

FOREIGN PATENT DOCUMENTS

| | | | | |
|---|---|---|---|---|
| JP | 2008159916 | A | | 7/2008 |
| JP | 5569532 | B2 | | 8/2014 |
| JP | 2016115847 | A | * | 6/2016 |
| JP | 2017028250 | A | | 2/2017 |
| JP | 2019012762 | A | | 1/2019 |
| JP | 6614326 | B2 | | 12/2019 |
| JP | 6737336 | B2 | | 8/2020 |
| JP | 6780777 | B2 | | 11/2020 |
| WO | 2015049815 | A1 | | 4/2015 |
| WO | 2017141998 | A1 | | 8/2017 |
| WO | 2018016543 | A1 | | 1/2018 |
| WO | 2018030440 | A1 | | 2/2018 |
| WO | 2018220879 | A1 | | 12/2018 |
| WO | 2019142706 | A1 | | 7/2019 |

OTHER PUBLICATIONS

International Search Report and Written Opinion (ISA/237) of the International Search Authority for International Patent Application No. PCT/JP2022/032121, mailed by the Japan Patent Office on Nov. 8, 2022.

Office Action issued for related German Application 11 2022 000 506.8, issued by the German Patent and Trademark Office on Mar. 23, 2026.

* cited by examiner

INSULATED GATE BIPOLAR TRANSISTOR

The contents of the following patent application(s) are incorporated herein by reference:

NO. 2021-151593 filed in JP on Sep. 16, 2021

NO. PCT/JP2022/032121 filed in WO on Aug. 25, 2022

BACKGROUND

1. Technical Field

The present invention relates to an insulated gate bipolar transistor.

2. Related Art

Conventionally, in an insulated gate bipolar transistor (IGBT), a structure is known in which an N+ type accumulation region is provided between a P type base layer and an N type drift layer (For example, see Patent document 1 and 2).

PRIOR ART DOCUMENT

Patent Document

Patent document 1: WO2019/142706

Patent document 2: Japanese Patent Application Publication No. 2017-28250

DESCRIPTION OF EXEMPLARY EMBODIMENTS

Figure 1:
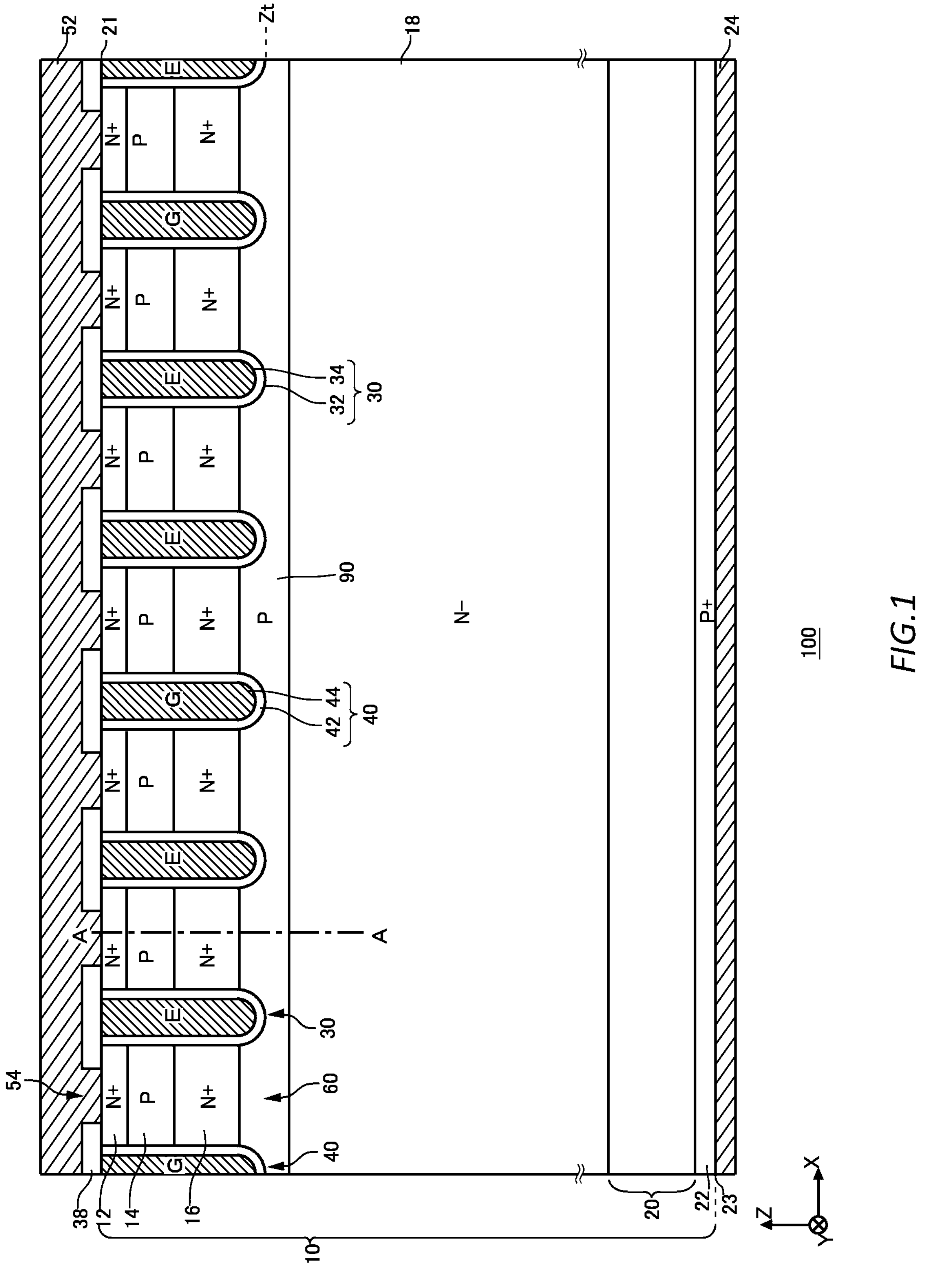
FIG. 1 is a cross-sectional view showing an example of a semiconductor device 100 according to an embodiment of the present invention.

Hereinafter, the present invention will be described through embodiments of the present invention, but the following embodiments do not limit the present invention according to claims. In addition, not all combinations of features described in the embodiment are essential to the solution of the invention.

As used herein, one side in a direction parallel to a depth direction of a semiconductor substrate is referred to as "upper" and the other side is referred to as "lower". One surface of two principal surfaces of a substrate, a layer, or another member is referred to as an upper surface, and the other surface is referred to as a lower surface. "Upper" and "lower" directions are not limited to a direction of gravity, or a direction in which a semiconductor device is mounted.

As used herein, technical matters may be described with orthogonal coordinate axes consisting of an X axis, a Y axis, and a Z axis. The orthogonal coordinate axes are merely for specifying relative positions of components, and are thus not for limiting to a specific direction. For example, the Z axis is not limited to represent a height direction with respect to the ground. Note that a +Z axis direction and a −Z axis direction are directions opposite to each other. When a direction is referred to as a "Z axis direction" without these "+" and "−" signs, it means the Z axis direction is parallel to +Z and −Z axes.

In the present specification, orthogonal axes parallel to an upper surface and lower surface of a semiconductor substrate are referred to as the X axis and the Y axis. Further, an axis perpendicular to the upper surface and the lower surface of the semiconductor substrate is referred to as the Z axis. As used herein, a direction of the Z axis may be referred to as a depth direction. Further, in the present specification, a direction parallel to the upper surface and the lower surface of the semiconductor substrate may be referred to as a horizontal direction, including the X axis direction and the Y axis direction.

Further, the region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

As used herein, phrases such as "same" or "equal" may be used even when there is an error caused due to a variation in a fabrication step or the like. This error is within a range of 10% or less, for example.

In the present specification, a conductivity type of a doping region where doping has been carried out with an impurity is described as a P type or an N type. In the present specification, the impurity may particularly mean either a donor of the N type or an acceptor of the P type and may be described as a dopant. In the present specification, doping means introducing the donor or the acceptor into the semiconductor substrate and turning it into a semiconductor showing a conductivity type of the N type, or a semiconductor showing a conductivity type of the P type.

A P+ type or an N+ type described in the present specification means a doping concentration higher than that of the P type or the N type, and a P− type or an N− type described herein means a doping concentration lower than that of the P type or the N type. Furthermore, a P++ type or an N++ type described in the present specification means a higher doping concentration than that of the P+ type or the N+ type. In the present specification, a unit system is an SI base unit system unless otherwise particularly noted. Although a unit of length may be expressed in cm, calculations may be carried out after conversion to meters (m).

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, when the donor concentration is referred to as $N_D$ and the acceptor concentration is referred to as $N_A$, the net doping concentration at any position is given as $N_D-N_A$. In the present specification, the net doping concentration may be simply referred to as the doping concentration.

Furthermore, when a concentration distribution of the donor, acceptor, or net doping has a peak, a value of the peak may be set as the concentration of the donor, acceptor, or net doping in the region. When the concentration of the donor, acceptor, or net doping is approximately uniform in a region, or the like, an average value of the concentration of the donor, acceptor, or net doping in the region may be set as the concentration of the donor, acceptor, or net doping. In the present specification, atoms/$cm^3$ or/$cm^3$ is used to indicate a concentration per unit volume. This unit is used for a donor or acceptor concentration in the semiconductor substrate. A notation of atoms may be omitted.

FIG. 1 is a cross-sectional view showing an example of a semiconductor device 100 according to an embodiment of the present invention. The semiconductor device 100 includes a portion which functions as an IGBT. The portion which functions as an IGBT is indicated in the cross section of FIG. 1.

The semiconductor device 100 includes a semiconductor substrate 10, an interlayer dielectric film 38, an emitter electrode 52, and a collector electrode 24. The semiconductor substrate 10 is a substrate that is formed of a semiconductor material. The semiconductor substrate 10 is, as an example, a silicon substrate, but not limited thereto. The semiconductor substrate 10 may be a compound semiconductor substrate such as silicon carbide or gallium nitride.

The semiconductor substrate 10 includes an upper surface 21 and a lower surface 23. The upper surface 21 and the lower surface 23 are two principal surfaces located on the semiconductor substrate 10 to face each other. The semiconductor device 100 in the present example is a vertical device in which a main current flows between the upper surface 21 and the lower surface 23 when the IGBT is controlled to be in an on-state.

The interlayer dielectric film 38 is provided in an upper surface 21 of the semiconductor substrate 10. The interlayer dielectric film 38 is a film including at least one layer of a dielectric film such as silicate glass added with impurities of boron, phosphorus, or the like, a thermally oxidized film, or other dielectric films. The interlayer dielectric film 38 is provided with a contact hole 54 which exposes the upper surface 21 of the semiconductor substrate 10.

The emitter electrode 52 is provided above the interlayer dielectric film 38. The emitter electrode 52 is in contact with an upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, a direction in which the emitter electrode 52 is connected to the collector electrode 24 (the Z axis direction) is referred to as the depth direction.

The semiconductor substrate 10 includes an N− type drift region 18. The drift region 18 in the semiconductor substrate 10 may be a remaining region which is a region where the dopant is not implanted locally. That is, the semiconductor device 100 may be fabricated by locally implanting the dopant to an N− type semiconductor substrate 10.

In the semiconductor substrate 10, an N+ type emitter region 12, a P type base region 14, an N+ type accumulation region 16 and a P type lower end region 90 are provided in sequence from the upper surface 21 side of the semiconductor substrate 10.

The emitter region 12 is provided to be exposed to the upper surface 21 of the semiconductor substrate 10. The emitter region 12 is electrically connected to the emitter electrode 52 via the contact hole 54.

The base region 14 is provided between the emitter region 12 and the accumulation region 16. The base region 14 may have a portion which is exposed to the upper surface 21 of the semiconductor substrate 10. The base region 14 is electrically connected to the emitter electrode 52 via the contact hole 54.

The accumulation region 16 is provided between the base region 14 and the lower end region 90. The accumulation region 16 is a region with a doping concentration higher than that of the drift region 18. By providing the accumulation region 16 having the high concentration between the drift region 18 and the base region 14, it is possible to improve a carrier injection enhancement effect (IE effect) and reduce an on-voltage. The accumulation region 16 may be provided such that it covers the entire lower surface of the base region 14.

The lower end region 90 is provided between the accumulation region 16 and the drift region 18. The lower end region 90 is a floating region which is electrically separated from the emitter electrode 52. The lower end region 90 is provided to be in contact with at least a part of the lower ends of the gate trench portion 40 or the dummy trench portion 30 described below. In the present specification, the gate trench portion 40 or the dummy trench portion 30 may be simply referred to as a trench portion. If it is referred to as a trench portion, it refers to at least one of the gate trench portion 40 or the dummy trench portion 30. By providing the lower end region 90, the drift region 18 can be quickly depleted at the turn-off of the IGBT and thereby a turn-off loss can be reduced (see Patent document 2).

An N+ type buffer region 20 may be provided below the drift region 18. The doping concentration of the buffer region 20 is higher than the doping concentration of the drift region 18. The buffer region 20 may function as a field stop layer to prevent the depletion layer which is extending from the lower end of the base region 14 to the drift region 18 from reaching a P+ type collector region 22.

The P+ type collector region 22 is provided below the buffer region 20. A doping concentration of the collector region 22 is higher than a doping concentration of the base region 14. The collector region 22 is exposed to the lower surface 23 of the semiconductor substrate 10 and is electrically connected to the collector electrode 24.

One or more gate trench portions 40 and one or more dummy trench portions 30 are provided on the upper surface 21 of the semiconductor substrate 10. In each drawing, the gate trench portion 40 may be provided with a symbol 'G', and the dummy trench portion 30 may be provided with a symbol 'E'. Each trench portion is arranged at a predetermined interval along a predetermined array direction (the X axis direction in FIG. 1) on the upper surface 21 of the semiconductor substrate 10. In addition, each trench portion is extended to have a longitudinal length in a predetermined extending direction (the Y axis direction in FIG. 1) on the upper surface 21 of the semiconductor substrate 10.

Note that, in FIG. 1, two dummy trench portions 30 are arrayed between two gate trench portions 40 as G/E/E/G/••, but one dummy trench portion 30 may be arrayed between two gate trench portions 40 as G/E/G/E/••. The array of the gate trench portion 40 and the dummy trench portion 30 may have another pattern.

Each trench portion is provided from the upper surface 21 of the semiconductor substrate 10 to a portion below the accumulation region 16. In the present specification, a region sandwiched by two trench portions inside the semiconductor substrate 10 may be referred to as a mesa portion 60. Each mesa portion 60 is provided with an emitter region 12, a base region 14, and an accumulation region 16. In the mesa portion 60, a part of the lower end region 90 may be provided.

The gate trench portion 40 includes a gate trench, a gate dielectric film 42, and a gate conductive portion 44 provided on the upper surface 21 of the semiconductor substrate 10. The gate trench is a groove provided to extend in a predetermined extending direction (the Y axis direction in FIG. 1) on the upper surface 21 of the semiconductor substrate 10.

The gate dielectric film 42 is provided to cover the inner wall of the gate trench. The gate dielectric film 42 may be formed by oxidizing or nitriding a semiconductor on the inner wall of the gate trench. The gate conductive portion 44 is provided on an inner side of the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to a gate pad which is located above the upper surface 21 of the semiconductor substrate 10, and a gate voltage is applied thereto. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench, a dummy dielectric film 32, and a dummy conductive portion 34 provided on the upper surface 21 of the semiconductor substrate 10. The dummy conductive portion 34 is electrically connected to the emitter electrode 52. The dummy conductive portion 34 may be a floating potential. The dummy dielectric film 32 is provided to cover an inner wall of the dummy trench. The dummy conductive portion 34 is provided inside the dummy trench, and is provided on an inner side of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction. By providing the dummy trench portion 30, the IE effect can be further improved.

The lower end region 90 described above is in contact with the lower end of at least one gate trench portion 40. The lower end region 90 may be in contact with the lower end of a plurality of gate trench portions 40. In FIG. 1, a depth position of the lower end of the gate trench portion 40 is Zt. The lower end region 90 may also be in contact with the lower end of at least one dummy trench portion 30. The lower end region 90 may be in contact with the lower end of a plurality of dummy trench portions 30. The lower end region 90 may be continuously provided over the plurality of trench portions provided that are along the array direction. The lower end region 90 may be located to cover a portion below a plurality of mesa portions 60. The lower end region 90 may be provided for all of the mesa portions 60.

Figure 2:
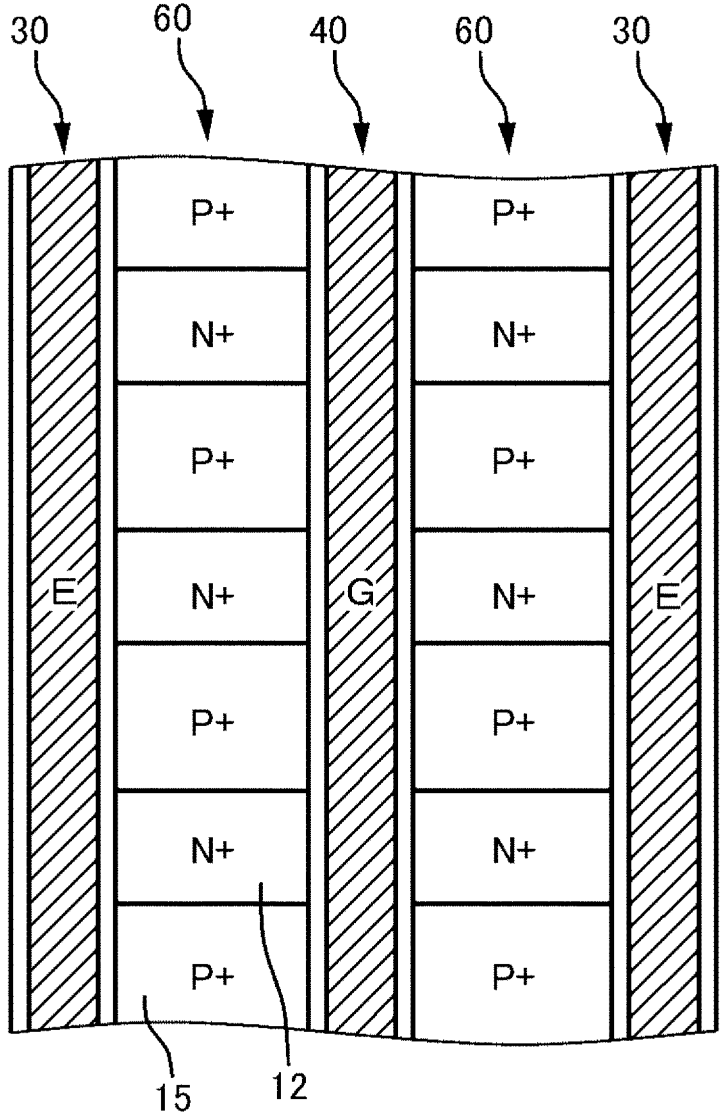
FIG. 2 is an enlarged view showing an example of a trench portion and a mesa portion 60 in an upper surface 21 of a semiconductor substrate 10.
Figure 2:
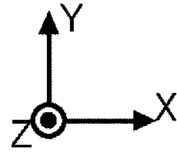

FIG. 2 is an enlarged view showing an example of a trench portion and a mesa portion 60 in an upper surface 21 of a semiconductor substrate 10. As described above, each trench portion is provided to be extended in the Y axis direction. A region sandwiched between trench portions is a mesa portion 60.

The mesa portion 60 may include an emitter region 12 and a contact region 15 exposed to the upper surface 21 of the semiconductor substrate 10. The contact region 15 is a P+ type region having a doping concentration higher than that of the base region 14. The contact region 15 is exposed to the upper surface 21 of the semiconductor substrate 10, and it is in contact with the base region 14 on the lower surface. The emitter region 12 and the contact region 15 in the present example are located alternately along the extending direction of the trench portion (the Y axis direction). The cross section in FIG. 1 is an XZ plane passing through the emitter region 12 indicated in FIG. 2.

Figure 3:
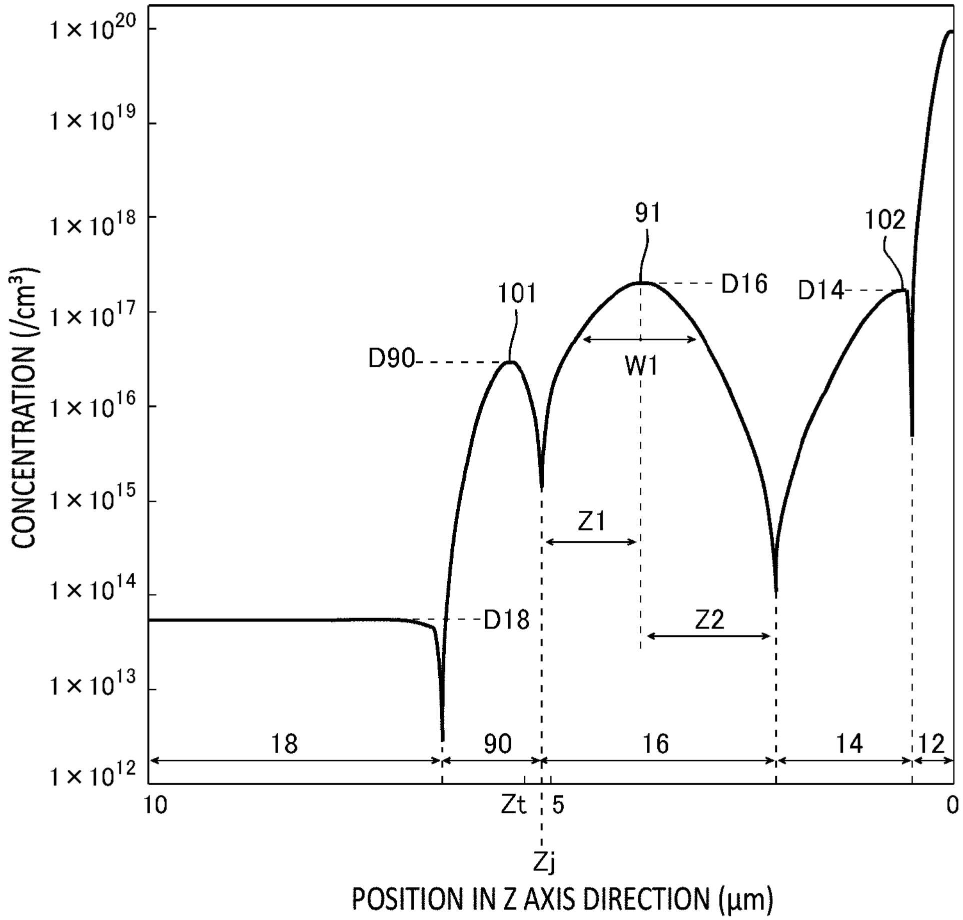
FIG. 3 shows an example of a doping concentration distribution in a depth direction in the line A-A of FIG. 1.

FIG. 3 shows an example of a doping concentration distribution in a depth direction in the line A-A in FIG. 1. The horizontal axis in FIG. 3 indicates a distance from the upper surface 21 of the semiconductor substrate 10, and the vertical axis indicates a doping concentration (km 3). The doping concentration distribution may be a distribution measured by spreading resistance profiling (SRP) method. The line A-A is a line which passes through a part of the emitter region 12, base region 14, accumulation region 16, the lower end region 90 and the drift region 18 and is parallel to the Z axis. The emitter region 12, the base region 14, the accumulation region 16 and the lower end region 90 in the present example are regions that are formed by locally implanting a dopant into an N− type semiconductor substrate 10. In the present specification, a maximum value of the doping concentration in each region may be the doping concentration of each region.

The drift region 18 is an N− type region having an approximately constant doping concentration in the depth direction. Approximately constant may mean that, for example, the maximum value of the doping concentration may be equal to or less than twice the minimum value, or may be equal to or less than 1.5 times the minimum value. In FIG. 3, the doping concentration of the drift region 18 is referred to as D18. The doping concentration D18 may be an average value or a maximum value of the doping concentration of the drift region 18. The doping concentration D18 of the drift region 18 may $1\times10^{13}/cm^3$ or more, or $1\times10^{15}/cm^3$ or less. The doping concentration D18 may be $1\times10^{14}/cm^3$ or less. The drift region 18 may be provided over ⅓ or more of the thickness of the semiconductor substrate 10 in the Z axis direction, or may be provided over ½ or more thereof.

The emitter region 12 is an N+ type region having a doping concentration higher than that of the drift region 18. The emitter region 12 may have a concentration peak nearby the upper surface 21 of the semiconductor substrate 10. A maximum value of the doping concentration of the emitter region 12 may be $1\times10^{18}/cm^3$ or more, or may be $1\times10^{19}/cm^3$ or more.

The base region 14 is a P type region having a doping concentration higher than that of the drift region 18 and a doping concentration lower than that of the emitter region 12. A PN junction is formed in a boundary between the base region 14 and the emitter region 12, at which the doping concentration is decreasing steeply. The base region 14 may have a base concentration peak 102 nearby the boundary between the emitter region 12 and itself. In FIG. 3, a maximum value of the doping concentration of the base region 14 (that is, a doping concentration at a local maximum of the base concentration peak 102) is referred to as D14. The doping concentration D14 may be $1\times10^{16}/cm^3$ or more or may be $1\times10^{17}/cm^3$ or more. The doping concentration D14 may be $1\times10^{19}/cm^3$ or less, or may be $1\times10^{18}/cm^3$ or less.

The lower end region 90 is a P type region having a doping concentration higher than that of the drift region 18 and a doping concentration lower than that of the emitter region 12. The lower end region 90 may have a doping concentration lower than that of the base region 14. A PN junction is formed in each of a boundary between the lower end region 90 and the drift region and a boundary between the lower end region 90 and the accumulation region 16, at which a doping concentration is decreasing steeply. The lower end region 90 may have a concentration peak 101. A maximum value of the doping concentration of the lower end region 90 (that is, a doping concentration at a local maximum of the concentration peak 101) is referred to as D90. The doping concentration D90 may be $1\times10^{15}/cm^3$ or more, or may be $1\times10^{16}/cm^3$ or more. The doping concentration D90 may $1\times10^{18}/cm^3$ or less, or may be $1\times10^{17}/cm^3$ or less.

The accumulation region 16 is an N+ type region having a doping concentration higher than that of the drift region 18 and a doping concentration lower than that of the emitter region 12. The accumulation region 16 may have a doping concentration higher than or lower than that of the base region 14. In addition, the accumulation region 16 may have a doping concentration higher than or lower than that of the lower end region 90. A PN junction is formed in each of a boundary between the accumulation region 16 and the lower end region 90 and a boundary between the accumulation region 16 and the base region 14, at which a doping concentration is decreasing steeply. A portion which is sandwiched between two PN junctions and has a doping concentration higher than that of the drift region 18 may be the accumulation region 16.

The accumulation region 16 has a first concentration peak 91 in a doping concentration distribution in a depth direction. A doping concentration D16 at a local maximum of the first concentration peak 91 is a maximum value of the doping concentration of the accumulation region 16. The first concentration peak 91 has an upper tail at which the doping concentration decreases from the local maximum forward the upper surface 21 and a lower tail at which the doping concentration decreases from the local maximum to the lower surface 23. The accumulation region 16 in the present example has no concentration peak other than the first concentration peak 91 in the depth direction. That is, the accumulation region 16 has a single concentration peak in the depth direction.

By increasing the doping concentration D16 of the accumulation region 16, the IE effect can be improved. On the other hand, if the doping concentration D16 is increased, the extension of the depletion layer from the base region 14 is inhibited, at the turn-off of the semiconductor device 100, by the accumulation region 16. Thus, an electric field is concentrated nearby the first concentration peak 91 of the accumulation region 16.

In the present example, a distance Z1 between the first concentration peak 91 and the lower end region 90 in a depth direction is less than a distance Z 2 between the first concentration peak 91 and the base region 14 in a depth direction. Note that a position of the local maximum of the first concentration peak 91 may be a position of the first concentration peak 91 in the depth direction. In addition, a position of a PN junction between the first concentration peak 91 and the lower end region 90 may be a position of an upper end of the lower end region 90. In addition, a position of a PN junction between the first concentration peak 91 and the base region 14 may be a position of a lower end of the base region 14.

According to the present example, as the first concentration peak 91 is located apart from the base region 14, a doping concentration gradient nearby the PN junction is gradual, and a depletion layer nearby the base region 14 is easily extended. Thus, a position at which the electric field is concentrated can be positioned apart from the base region 14, and a withstand capability of the semiconductor device 100 can be improved. Note that the first concentration peak 91 approaches the lower end region 90, but as a forward bias is applied between the lower end region 90 and the accumulation region 16 at the turn-off of the semiconductor device 100, a withstand capability at the turn-off is not deteriorated.

The distance Z1 may be equal to or less than 0.9 times, 0.7 times or 0.5 times the distance Z2. Note that if the first concentration peak 91 is too close to the lower end region 90, the IE effect may be suppressed. Thus, the distance Z1 may be 0.5 μm or more, may be 0.7 μm or more, or may be 1 μm or more.

In addition, the distance Z2 may be 1 μm or more, may be 1.5 μm or more, or may be 2 μm or more. In addition, a distance between the local maximum of the base concentration peak 102 and the local maximum of the first concentration peak 91 in the Z axis direction may be 2 μm or more, may be 2.5 μm or more, or may be 3 μm or more.

The doping concentration D 16 of the first concentration peak 91 may be $1\times10^{15}/cm^3$ or more, or may be $1\times10^{16}/cm^3$ or more. Note that if the doping concentration D16 of the first concentration peak 91 is too high, the electric field strength at the first concentration peak 91 increases. If the electric field at the first concentration peak 91 exceeds the electric field at the lower end of the trench portion, the withstand capability of the semiconductor device 100 decreases. The doping concentration D16 may be $1\times10^{18}/cm^3$ or less, or may be $1\times10^{17}/cm^3$ or less.

A full width at half maximum W1 of the first concentration peak 91 in the depth direction may be 2 μm or more. The full width at half maximum is a width of a region including the local maximum of the first concentration peak 91 and having a doping concentration of 0.5×D16 or more. By increasing the full width at half maximum W1, an integrated concentration of the accumulation region 16 is easily increased without increasing the doping concentration D16. Thus, a local electric field strength is easily suppressed. A full width at half maximum W1 may be 2.5 μm or more, or may be 3 μm or more. In addition, the full width at half maximum W1 may be half or more of a distance from the base region 14 to the lower end region 90 (Z1+Z2 in FIG. 3).

In addition, an integrated concentration obtained by integrating the doping concentration of the first concentration peak 91 in a depth direction may be $1\times10^{15}/cm^2$ or more and $1.5\times10^{17}/cm^2$ or less. The integrated concentration may be $5\times10^{15}/cm^2$ or more. The integrated concentration may be $1\times10^{17}/cm^2$ or less. The integrated concentration may use a value obtained by integrating the doping concentration in a range of the full width at half maximum W1 of the first concentration peak 91. The IE effect decreases if the integrated concentration is low, and the withstand capability is easily decreased if the integrated concentration is high.

Note that, comparing the clamp withstand capability at the turn-off of a semiconductor device 100 having a doping concentration D16 of the first concentration peak 91 greater than the doping concentration D 90 of the lower end region 90 with the clamp withstand capability at the turn-off of a semiconductor device 100 having a doping concentration D16 of the first concentration peak 91 less than the doping concentration D 90 of the lower end region 90, the former had its withstand capability being improved. Preferably, the doping concentration D16 of the first concentration peak 91 is greater than the doping concentration D90 of the lower end region 90. The doping concentration D 16 may be 1.5 or more times greater, two or more times greater, or five or more times greater than the doping concentration D 90.

In addition, the accumulation region 16 may be in contact with the base region 14. That is, no drift region 18 remains between the accumulation region 16 and the base region 14, and a region of the doping concentration D18 which is the same as the drift region 18 is not provided. Similarly, the accumulation region 16 may be in contact with the lower end region 90. That is, no drift region 18 remains between the accumulation region 16 and the lower end region 90, and a region of the doping concentration D18 which is the same as the drift region 18 is not provided. However, a doping concentration distribution of a spiked shape in the PN junction portion between each region may include a point which is a doping concentration D18.

In the example of FIG. 3, a depth position of the boundary between the lower end region and the accumulation region 16 is referred to as Zj. If the accumulation region 16 is formed to a portion lower than the lower end of the gate trench portion 40, a static breakdown voltage of the semiconductor device 100 decreases. The depth position Zj may be located closer to the upper surface 21 side of the semiconductor substrate 10 than the depth position Zt of the lower end of the gate trench portion 40. A distance between the depth position Zj and the depth position Zt in the Z axis direction may be 0.1 μm or more, may be 0.2 μm or more, or may be 0.3 μm or more.

Figure 4:
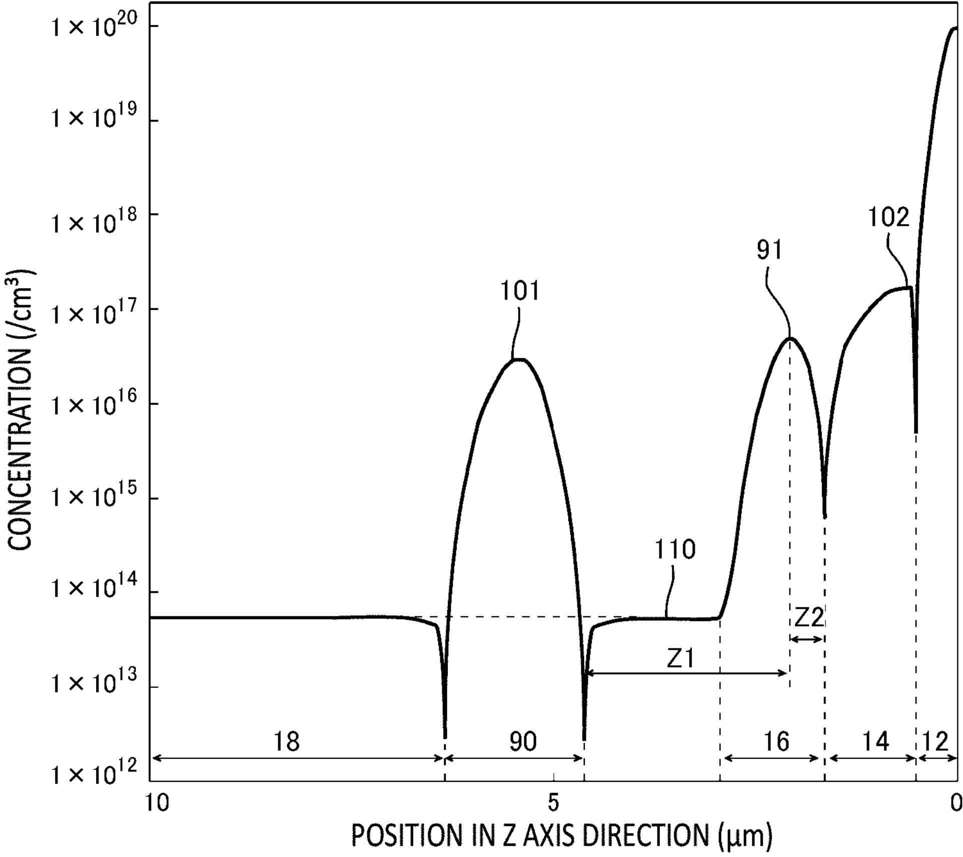
FIG. 4 shows a doping concentration distribution according to a comparative example.

FIG. 4 shows a doping concentration distribution according to a comparative example. In the present example, the distance Z2 is less than the distance Z1. That is, the first concentration peak 91 is located nearby the base region 14. In addition, a region 110 having a doping concentration same as that of the drift region 18 is provided between the accumulation region 16 and the lower end region 90.

In the semiconductor device of the present example, the first concentration peak 91 is located nearby the base region 14. Thus, a clamp withstand capability at the turn-off of the semiconductor device is less than a clamp withstand capability at the turn-off of the semiconductor device 100 in the example shown in FIG. 3.

Figure 5:
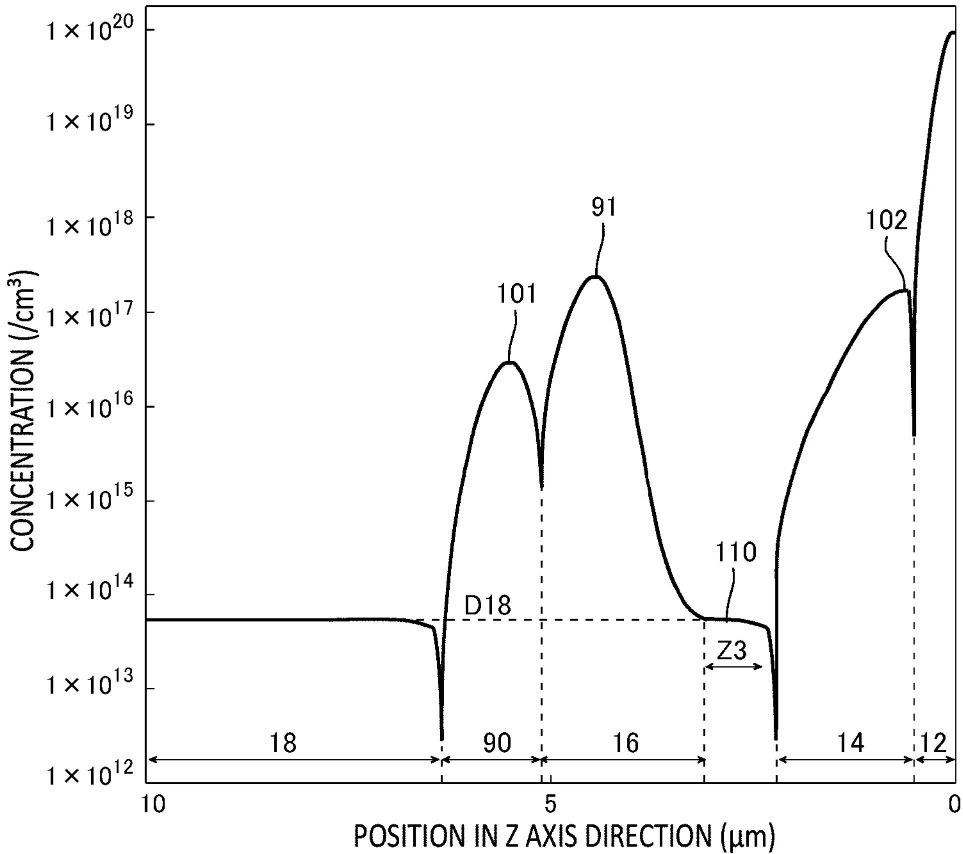
FIG. 5 shows another example of a doping concentration distribution of a depth direction in the line A-A of FIG. 1.

FIG. 5 shows another example of a doping concentration distribution of a depth direction in the line A-A of FIG. 1. The doping concentration distribution in the present example is different from the example in FIG. 3 in that it includes the region 110. Except the region 110, the doping concentration distribution in the present example is similar to the example in FIG. 3.

The region 110 is located between the accumulation region 16 and the base region 14. The region 110 is a region having a doping concentration same as that of the drift region 18. Note that a doping concentration with an error within ±10% for the doping concentration D18 may be the same doping concentration as that of the drift region 18. The region 110 may be a region in which a drift region 18 remains without forming a base region 14 and an accumulation region 16. A length in the Z axis direction of the region 110 is referred to as Z3. The length Z3 may be 0.3 μm or more, or may be 0.5 μm or more.

By providing the region 110, a distance between the first concentration peak 91 and the base region 14 is easily increased. In this way, the clamp withstand capability at the turn-off of the semiconductor device 100 can be improved.

Figure 6:
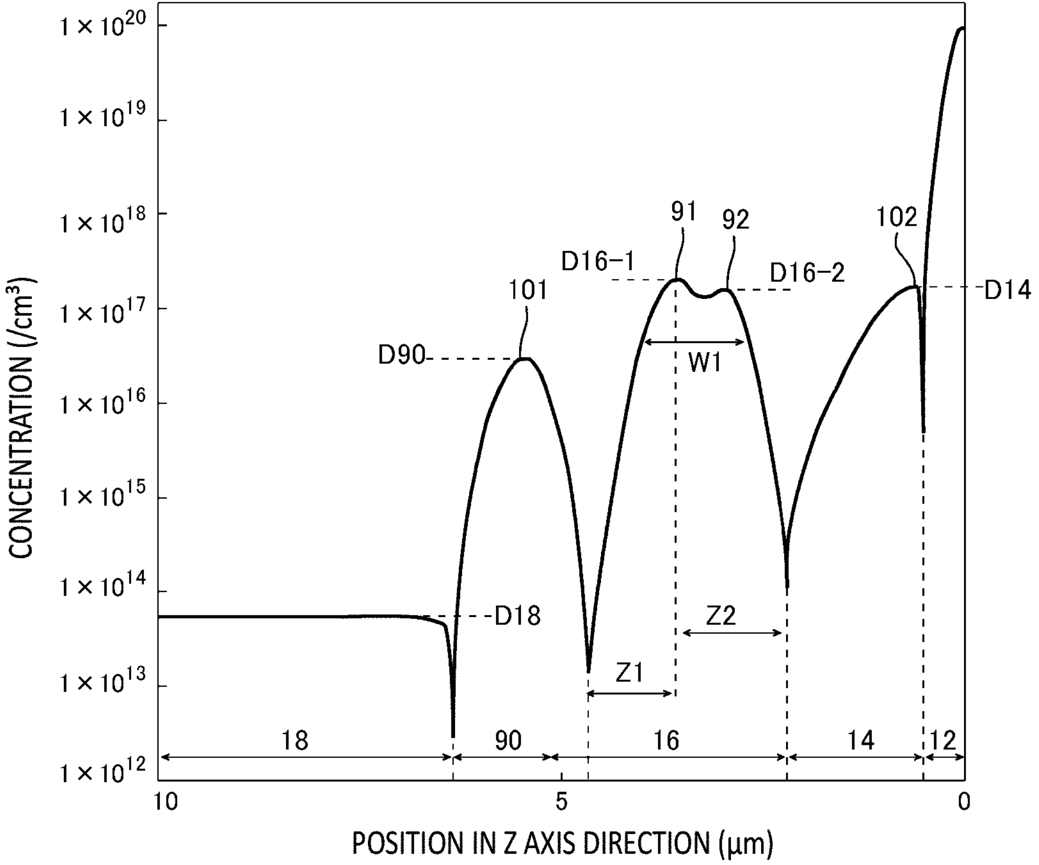
FIG. 6 shows another example of a doping concentration distribution of a depth direction in the line A-A of FIG. 1.

FIG. 6 shows another example of a doping concentration distribution of a depth direction in the line A-A of FIG. 1. The doping concentration distribution in the present example is different from the example in FIG. 3 in that it has a second concentration peak 92. Except for the second concentration peak 92, the doping concentration distribution in the present example is similar to the example in FIG. 3. In the present example, the region 110 indicated in FIG. 5 may also be provided.

The second concentration peak 92 is located on a different location from the first concentration peak 91 in the depth direction. The position of each concentration peak may use a position of a local maximum. A local maximum of the second concentration peak 92 may be located in a range of the full width at half maximum W1 of the first concentration peak 91. That is, a doping concentration of a region between the first concentration peak 91 and the second concentration peak 92 is greater than 0.5 times of the doping concentration of the first concentration peak 91. A local maximum of the second concentration peak 92 may be located outside of a range of the full width at half maximum W1 of the first concentration peak 91.

A doping concentration D16-2 of the second concentration peak 92 is equal to or less than a doping concentration D16-1 of the first concentration peak 91. In the example of FIG. 6, the doping concentration D16-2 is less than the doping concentration D16-1. The doping concentration D 16-2 may be 0.1 times or more of the doping concentration D 16-1, or may be 0.5 times or more of the doping concentration D 16-1.

Providing the second concentration peak 92 causes an integrated concentration in the accumulation region 16 to be easily maintained while reducing each concentration peak. Thus, an electric field strength for one concentration peak can be reduced.

Note that the second concentration peak 92 may be located between the first concentration peak 91 and the base region 14. That is, a greater concentration peak may be located farther from the base region 14. In this way, a position in which the electric field strength can be easily caused can be located apart from the base region 14. Note that the accumulation region 16 may have three or more concentration peaks in a depth direction. Also in this case, the farther the concentration peak is apart from the base region 14, the greater the doping concentration may be.

Figure 7:
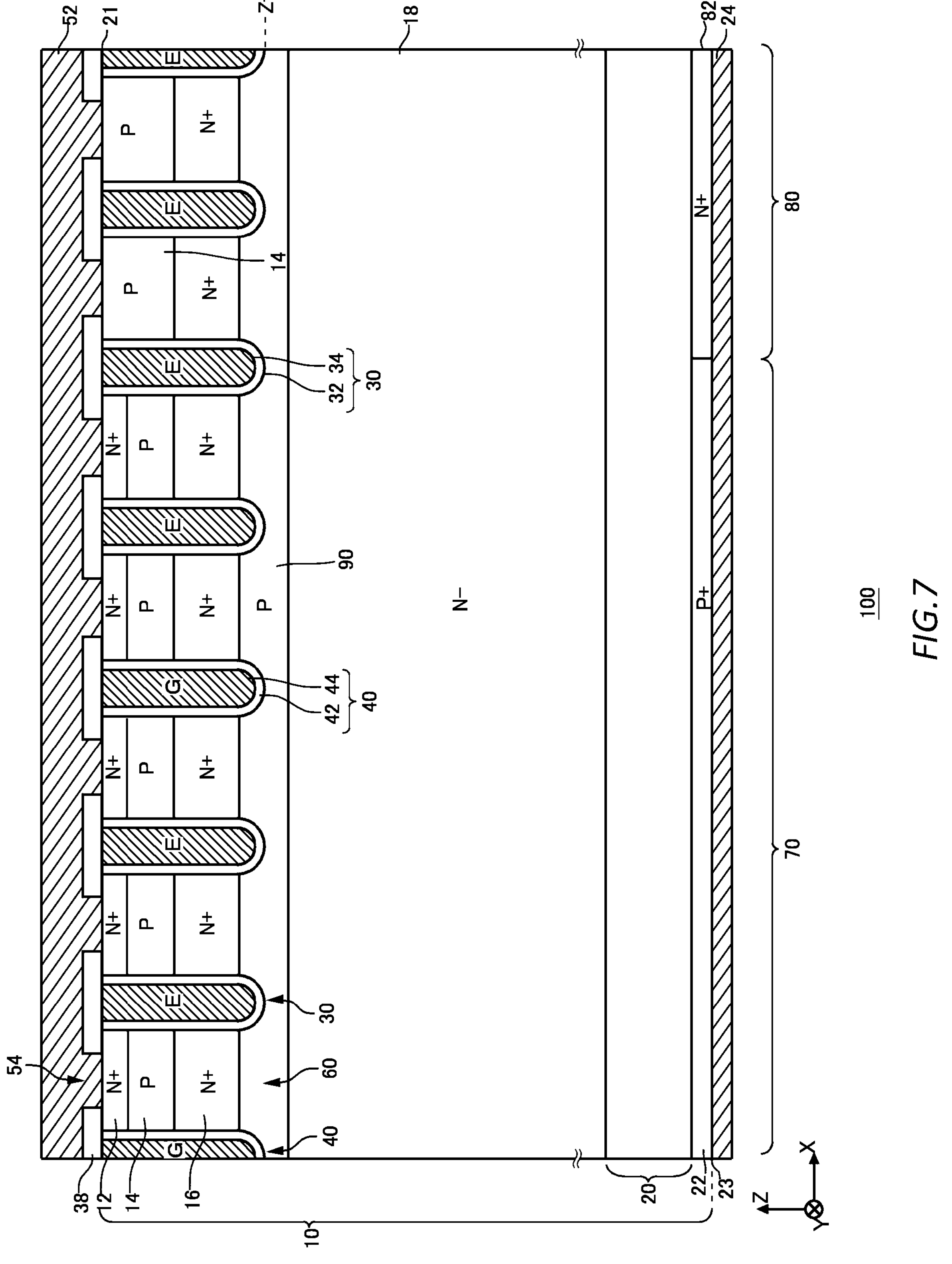
FIG. 7 shows another configuration example of the semiconductor device 100.

FIG. 7 shows another configuration example of the semiconductor device 100. The semiconductor device 100 of the present example includes the transistor portion 70 and a diode portion 80. The semiconductor device 100 of the present example is a reverse conducting IGBT (RC-IGBT) in which an IGBT and a refluxed diode are in a reverse parallel connection.

The transistor portion 70 and the diode portion 80 may be alternately located along the X axis direction. The transistor portion 70 has a structure similar to the semiconductor device 100 described in FIG. 1.

In the diode portion 80, a P type base region 14, an N+ type accumulation region 16, and a P type lower end region 90 are provided in sequence from the upper surface 21 side of the semiconductor substrate 10. The base region 14 in the diode portion 80 may be exposed to the upper surface 21 of the semiconductor substrate 10. In another example, a P+ type contact region 15 may be provided between the base region 14 and the upper surface 21. The accumulation region 16 and the lower end region 90 in the diode portion 80 are similar to the accumulation region 16 and the lower end region 90 in the transistor portion 70. That is, the diode portion 80 may have the doping concentration distribution described in FIG. 3, FIG. 5 or FIG. 6 except for the fact that it has no emitter region 12 provided.

Note that the diode portion 80 has an N+ type cathode region 82 instead of the collector region 22 of the transistor portion 70. A doping concentration of the cathode region 82 is higher than the doping concentration of the drift region 18. The cathode region 82 is exposed to the lower surface 23 of the semiconductor substrate 10 and is electrically connected to the collector electrode 24.

In the upper surface 21 of the semiconductor substrate 10 in the diode portion 80, one or more dummy trench portions 30 are provided. In the diode portion 80, the gate trench portion 40 may not be provided. The lower end region 90 in the diode portion 80 is in contact with the lower end of at least one dummy trench portion 30. The lower end region 90 may be in contact with the lower end of a plurality of dummy trench portions 30.

The RC-IGBT structure is described in FIG. 7, however, the semiconductor device 100 may be a reverse blocking IGBT (RB-IGBT). The RB-IGBT is a semiconductor device 100 in which a P type region is formed in a region that is in contact with a side surface of the semiconductor substrate 10 so that the PN junction is not exposed to the side surface of the semiconductor substrate 10. Structures other than the P type region are similar to the semiconductor device 100 described in FIG. 1 to FIG. 6.

Figure 8:
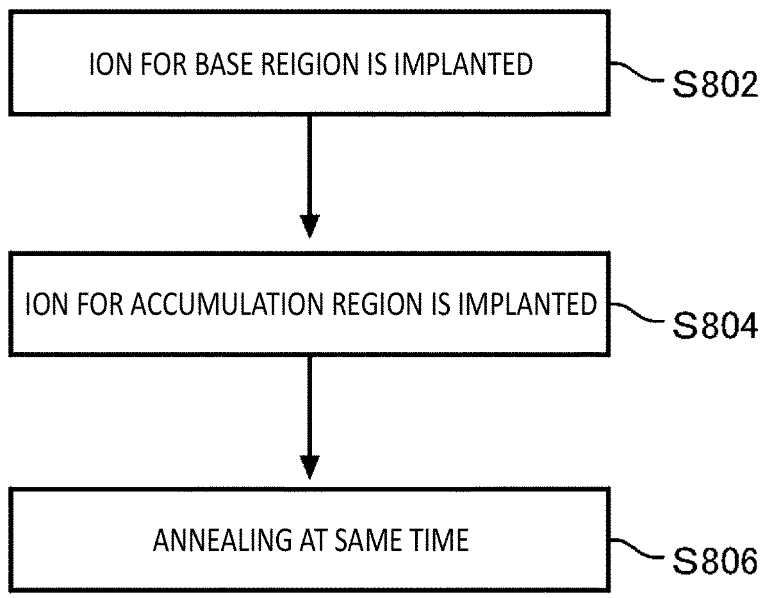
FIG. 8 shows some steps in a fabrication method of the semiconductor device 100.

FIG. 8 is a chart showing some steps in a fabrication method of the semiconductor device 100. In FIG. 8, a process for forming the base region 14 and the accumulation region 16 is shown. Structures other than the base region 14 and the accumulation region 16 may be formed before the process shown in FIG. 8, or may be formed after the process shown in FIG. 8.

First, in the first implantation step S802, a dopant ion for forming the base region 14 is implanted from the upper surface 21 of the semiconductor substrate 10. The dopant ion is boron, for example, but not limited thereto.

Then, in the second implantation step S804, a dopant ion for forming the accumulation region 16 is implanted from the upper surface 21 of the semiconductor substrate 10. The dopant ion is phosphorus or nitrogen, for example, but not limited thereto. In the second implantation step S804, a dopant ion is implanted into a position in which a local maximum of the first concentration peak 91 described in FIG. 3 or the like should be formed.

Then, in the annealing step S806, the semiconductor substrate 10 is annealed. Between the first implantation step S802 and the second implantation step S804, the semiconductor substrate 10 may not be annealed. That is, in the annealing step S806, a dopant for forming the base region 14 and a dopant for forming the accumulation region 16 is spread and activated. By such process, the base region 14 and the accumulation region 16 can be formed. Note that, between the first implantation step S802 and the second implantation step S804, the semiconductor substrate 10 may be annealed.

While the present invention has been described with the embodiments, the technical scope of the present invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the present invention.

Note that the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the operation flow is described by using phrases such as "first" or "next" in the scope of the claims, specification, or drawings, it does not necessarily mean that the process must be performed in this order.

What is claimed is:

1. An insulated gate bipolar transistor comprising:

a semiconductor substrate which has an upper surface and a lower surface, and in which a drift region of a first conductivity type is provided;

an emitter region of the first conductivity type which is provided between the upper surface of the semiconductor substrate and the drift region, and which has a doping concentration higher than that of the drift region;

a base region of a second conductivity type which is provided between the emitter region and the drift region;

an accumulation region of the first conductivity type which is provided between the base region and the drift region, and which has a doping concentration higher than that of the drift region;

a gate trench portion which is provided from the upper surface of the semiconductor substrate to a portion below the accumulation region; and a lower end region of the second conductivity type which is provided to be in contact with a lower end of the gate trench portion; wherein the accumulation region has a first concentration peak in which the doping concentration indicates a maximum value in a depth direction; and a distance between the first concentration peak and the lower end region in the depth direction is less than a distance between the first concentration peak and the base region in the depth direction, wherein a full width at half maximum of the first concentration peak in the depth direction is 2 μm or more.

2. The insulated gate bipolar transistor according to claim 1, wherein the accumulation region is in contact with the base region.

3. The insulated gate bipolar transistor according to claim 2, wherein the doping concentration of the first concentration peak is $2\times10^{18}/cm^3$ or less.

4. The insulated gate bipolar transistor according to claim 1, wherein a region with a same doping concentration as that of the drift region is provided between the accumulation region and the base region.

5. The insulated gate bipolar transistor according to claim 4, wherein the doping concentration of the first concentration peak is $2\times10^{18}/cm^3$ or less.

6. The insulated gate bipolar transistor according to claim 1, wherein the doping concentration of the first concentration peak is $2\times10^{18}/cm^3$ or less.

7. The insulated gate bipolar transistor according to claim 1, wherein the maximum value of the doping concentration of the accumulation region is greater than a maximum value of a doping concentration of the lower end region.

8. The insulated gate bipolar transistor according to claim 1, wherein a boundary between the lower end region and the accumulation region is located closer to the upper surface side of the semiconductor substrate than the lower end of the gate trench portion.

9. An insulated gate bipolar transistor comprising:

a semiconductor substrate which has an upper surface and a lower surface, and in which a drift region of a first conductivity type is provided;

an emitter region of the first conductivity type which is provided between the upper surface of the semiconductor substrate and the drift region, and which has a doping concentration higher than that of the drift region;

a base region of a second conductivity type which is provided between the emitter region and the drift region;

an accumulation region of the first conductivity type which is provided between the base region and the drift region, and which has a doping concentration higher than that of the drift region;

a gate trench portion which is provided from the upper surface of the semiconductor substrate to a portion below the accumulation region; and a lower end region of the second conductivity type which is provided to be in contact with a lower end of the gate trench portion; wherein the accumulation region has a first concentration peak in which the doping concentration indicates a maximum value in a depth direction; and a distance between the first concentration peak and the lower end region in the depth direction is less than a distance between the first concentration peak and the base region in the depth direction, wherein the base region has a base concentration peak in which a doping concentration indicates a maximum value in a depth direction; and a distance between the first concentration peak and the base concentration peak in the depth direction is 2 μm or more.

10. The insulated gate bipolar transistor according to claim 9, wherein the accumulation region is in contact with the base region.

11. The insulated gate bipolar transistor according to claim 9, wherein a region with a same doping concentration as that of the drift region is provided between the accumulation region and the base region.

12. The insulated gate bipolar transistor according to claim 9, wherein the doping concentration of the first concentration peak is $2\times10^{18}/cm^3$ or less.

13. The insulated gate bipolar transistor according to claim 9, wherein a boundary between the lower end region and the accumulation region is located closer to the upper surface side of the semiconductor substrate than the lower end of the gate trench portion.

14. An insulated gate bipolar transistor comprising:

a semiconductor substrate which has an upper surface and a lower surface, and in which a drift region of a first conductivity type is provided;

an emitter region of the first conductivity type which is provided between the upper surface of the semiconductor substrate and the drift region, and which has a doping concentration higher than that of the drift region;

a base region of a second conductivity type which is provided between the emitter region and the drift region;

an accumulation region of the first conductivity type which is provided between the base region and the drift region, and which has a doping concentration higher than that of the drift region;

a gate trench portion which is provided from the upper surface of the semiconductor substrate to a portion below the accumulation region; and a lower end region of the second conductivity type which is provided to be in contact with a lower end of the gate trench portion; wherein the accumulation region has a first concentration peak in which the doping concentration indicates a maximum value in a depth direction; and a distance between the first concentration peak and the lower end region in the depth direction is less than a distance between the first concentration peak and the base region in the depth direction, further including a dummy trench portion which is provided from the upper surface of the semiconductor substrate to a portion below the accumulation region; wherein the lower end region is in contact with a lower end of the dummy trench portion.

15. The insulated gate bipolar transistor according to claim 14, wherein the accumulation region is in contact with the base region.

16. The insulated gate bipolar transistor according to claim 14, wherein a region with a same doping concentration as that of the drift region is provided between the accumulation region and the base region.

17. The insulated gate bipolar transistor according to claim 14, wherein the doping concentration of the first concentration peak is $2\times10^{18}/cm^3$ or less.

18. The insulated gate bipolar transistor according to claim 14, wherein a boundary between the lower end region and the accumulation region is located closer to the upper surface side of the semiconductor substrate than the lower end of the gate trench portion.

19. An insulated gate bipolar transistor comprising:

a semiconductor substrate which has an upper surface and a lower surface, and in which a drift region of a first conductivity type is provided;

an emitter region of the first conductivity type which is provided between the upper surface of the semiconductor substrate and the drift region, and which has a doping concentration higher than that of the drift region;

a base region of a second conductivity type which is provided between the emitter region and the drift region;

an accumulation region of the first conductivity type which is provided between the base region and the drift region, and which has a doping concentration higher than that of the drift region;

a gate trench portion which is provided from the upper surface of the semiconductor substrate to a portion below the accumulation region; and a lower end region of the second conductivity type which is provided to be in contact with a lower end of the gate trench portion; wherein the accumulation region has a first concentration peak in which the doping concentration indicates a maximum value in a depth direction; and a distance between the first concentration peak and the lower end region in the depth direction is less than a distance between the first concentration peak and the base region in the depth direction, wherein the accumulation region further includes a second concentration peak that is located in a different location from the first concentration peak in a depth direction, and the second concentration peak has a doping concentration equal to or less than the first concentration peak.

20. The insulated gate bipolar transistor according to claim 19, wherein the doping concentration of the second concentration peak is less than the doping concentration of the first concentration peak; and the second concentration peak is located between the first concentration peak and the base region.

* * * * *